(12) United States Patent
Vijayen et al.

(10) Patent No.: US 9,390,964 B2
(45) Date of Patent: Jul. 12, 2016

(54) METHODS FOR FABRICATING DUAL DAMASCENE STRUCTURES IN LOW TEMPERATURE DIELECTRIC MATERIALS

(71) Applicant: APPLIED MATERIALS, INC., Santa Clara, CA (US)

(72) Inventors: Jayagatan Ram Vijayen, Sunnyvale, CA (US); Siva Suri Chandra Rao Bhesetti, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 109 days.

(21) Appl. No.: 14/212,908

(22) Filed: Mar. 14, 2014

(65) Prior Publication Data

US 2014/0287579 A1 Sep. 25, 2014

Related U.S. Application Data

(60) Provisional application No. 61/792,790, filed on Mar. 15, 2013.

(51) Int. Cl.
| | |
|---|---|
| *H01L 21/768* | (2006.01) |
| *H01L 23/498* | (2006.01) |
| *H01L 21/48* | (2006.01) |
| *H01J 37/32* | (2006.01) |

(52) U.S. Cl.
CPC ...... *H01L 21/76813* (2013.01); *H01L 21/4857* (2013.01); *H01L 21/76801* (2013.01); *H01L 23/49822* (2013.01); *H01J 37/321* (2013.01); *H01J 2237/334* (2013.01); *H01L 2224/16225* (2013.01); *H01L 2224/32225* (2013.01); *H01L 2224/73204* (2013.01); *H01L 2924/15311* (2013.01)

(58) Field of Classification Search
CPC .................. H01L 21/76813; H01L 24/76801; H01J 2237/334; H01J 37/321
See application file for complete search history.

(56) References Cited

U.S. PATENT DOCUMENTS

| | | | | |
|---|---|---|---|---|
| 6,399,511 | B2 * | 6/2002 | Tang | H01L 21/76807 257/E21.252 |
| 2003/0008512 | A1 | 1/2003 | Ali et al. | |
| 2005/0263892 | A1 | 12/2005 | Chun | |
| 2006/0216926 | A1 * | 9/2006 | Ye | H01L 21/7684 438/629 |
| 2007/0066072 | A1 | 3/2007 | Suh | |
| 2008/0020570 | A1 | 1/2008 | Naik | |
| 2013/0207175 | A1 * | 8/2013 | Sakamoto | H01L 21/32053 257/316 |
| 2013/0288474 | A1 | 10/2013 | Mishra et al. | |

\* cited by examiner

*Primary Examiner* — John P Dulka

(74) *Attorney, Agent, or Firm* — Moser Taboada; Alan Taboada

(57) ABSTRACT

Methods for fabricating dual damascene structures are provided herein. In some embodiments, a method for fabricating a dual damascene interconnect structure may include patterning a first mask layer atop a substrate disposed in a process chamber, wherein the substrate includes one or more low temperature dielectric layers to define a first etch pattern, and wherein the one or more low temperature dielectric layers are formed atop the substrate at a temperature below about 180 degrees Celsius; etching the first etch pattern into the one or more low temperature dielectric layers; patterning a second mask layer atop the substrate to define a second etch pattern, wherein the first etch pattern and the second etch pattern are aligned; and etching the second etch pattern into the one or more low temperature dielectric layers to form a dual damascene pattern in the substrate.

20 Claims, 7 Drawing Sheets

METHODS FOR FABRICATING DUAL DAMASCENE STRUCTURES IN LOW TEMPERATURE DIELECTRIC MATERIALS

CROSS-REFERENCE TO RELATED APPLICATIONS

This application claims benefit of U.S. provisional patent application Ser. No. 61/792,790, filed Mar. 15, 2013, which is herein incorporated by reference.

FIELD

Embodiments of the present invention generally relate to methods for substrate processing. More specifically, embodiments provided herein are directed to methods for forming dual damascene interconnect structures in a substrate.

BACKGROUND

Dual damascene interconnect structures are used to create multi-level, high density metal interconnections needed for advanced, high performance integrated circuits (ICs). Forming dual damascene interconnect structures involves etching one or more dielectric layers, such as layers of silicon oxide, in a pattern to have trenches and vias that may be simultaneously filled with a metal to create the electrical connections from one side of a substrate to the other. In one application, dual damascene processing is used for creating connections in through silicon via (TSV) interposers used as an electrical interface to reroute connections, for example from an IC die, to a different connection, for example to a packaging substrate to which the IC is connected.

Conventional dielectric layers are typically formed of high temperature dielectric materials with the etching step executed in a dielectric etch chamber such as a capacitively coupled plasma reactor. However, as the technology nodes continue to shrink, new materials are being explored and used, such as low temperature dielectrics. However, the inventors have observed that low temperature dielectric materials are softer, and therefore, more difficult to process than high temperature dielectric materials.

Thus, the inventors have provided improved methods for fabricating dual damascene interconnect structures in low temperature dielectric materials.

SUMMARY

Methods for fabricating dual damascene structures in low temperature dielectric materials are provided herein. In some embodiments, a method for fabricating a dual damascene interconnect structure may include patterning a first mask layer atop a substrate disposed in a process chamber, wherein the substrate includes one or more low temperature dielectric layers to define a first etch pattern, and wherein the one or more low temperature dielectric layers are formed atop the substrate at a temperature below about 180 degrees Celsius; etching the first etch pattern into the one or more low temperature dielectric layers using an inductively coupled plasma formed by a power source capable of providing power within a range from about 10 watts to about 10,000 watts at a frequency of about 2 MHz to about 13.5 MHz; patterning a second mask layer atop the substrate to define a second etch pattern, wherein the first etch pattern and the second etch pattern are aligned; and etching the second etch pattern into the one or more low temperature dielectric layers to form a dual damascene pattern in the substrate, wherein a pressure of the process chamber during etching of the first etch pattern and the second etch pattern is about 10 mTorr to about 1000 mTorr.

In some embodiments, a computer readable medium, having instructions stored thereon that, when executed by a controller, cause a method of fabricating a dual damascene interconnect structure to be performed may include patterning a first mask layer atop a substrate disposed in a process chamber, wherein the substrate comprises one or more low temperature dielectric layers to define a first etch pattern, and wherein the one or more low temperature dielectric layers are formed atop the substrate at a temperature below about 180 degrees Celsius; etching the first etch pattern into the one or more low temperature dielectric layers using an inductively coupled plasma formed by a power source capable of providing power within a range from about 10 watts to about 10,000 watts at a frequency of about 2 MHz to about 13.5 MHz; patterning a second mask layer atop the substrate to define a second etch pattern, wherein the first etch pattern is aligned within the second etch pattern; etching the second etch pattern into the one or more low temperature dielectric layers to form a dual damascene pattern in the substrate, wherein a pressure of the process chamber during etching of the first etch pattern and the second etch pattern is about 10 mTorr to about 1000 mTorr; and filling the dual damascene pattern with a conductive material to form a dual damascene interconnect structure.

In some embodiments, a system for plasma etching a substrate comprising low temperature dielectrics may include an inductively coupled process chamber for processing a substrate; a controller comprising a computer readable medium, having instructions stored thereon that, when executed by a controller, cause a method of fabricating a dual damascene interconnect structure to be performed, the method comprising: patterning a first mask layer atop a substrate disposed in a process chamber, wherein the substrate comprises one or more low temperature dielectric layers to define a first etch pattern, and wherein the one or more low temperature dielectric layers are formed atop the substrate at a temperature below about 180 degrees Celsius; etching the first etch pattern into the one or more low temperature dielectric layers using an inductively coupled plasma formed by a power source capable of providing power within a range from about 10 watts to about 10,000 watts at a frequency of about 2 MHz to about 13.5 MHz; patterning a second mask layer atop the substrate to define a second etch pattern, wherein the first etch pattern is aligned within the second etch pattern; and etching the second etch pattern into the one or more low temperature dielectric layers to form a dual damascene pattern in the substrate, wherein a pressure of the process chamber during etching of the first etch pattern and the second etch pattern is about 10 mTorr to about 1000 mTorr.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
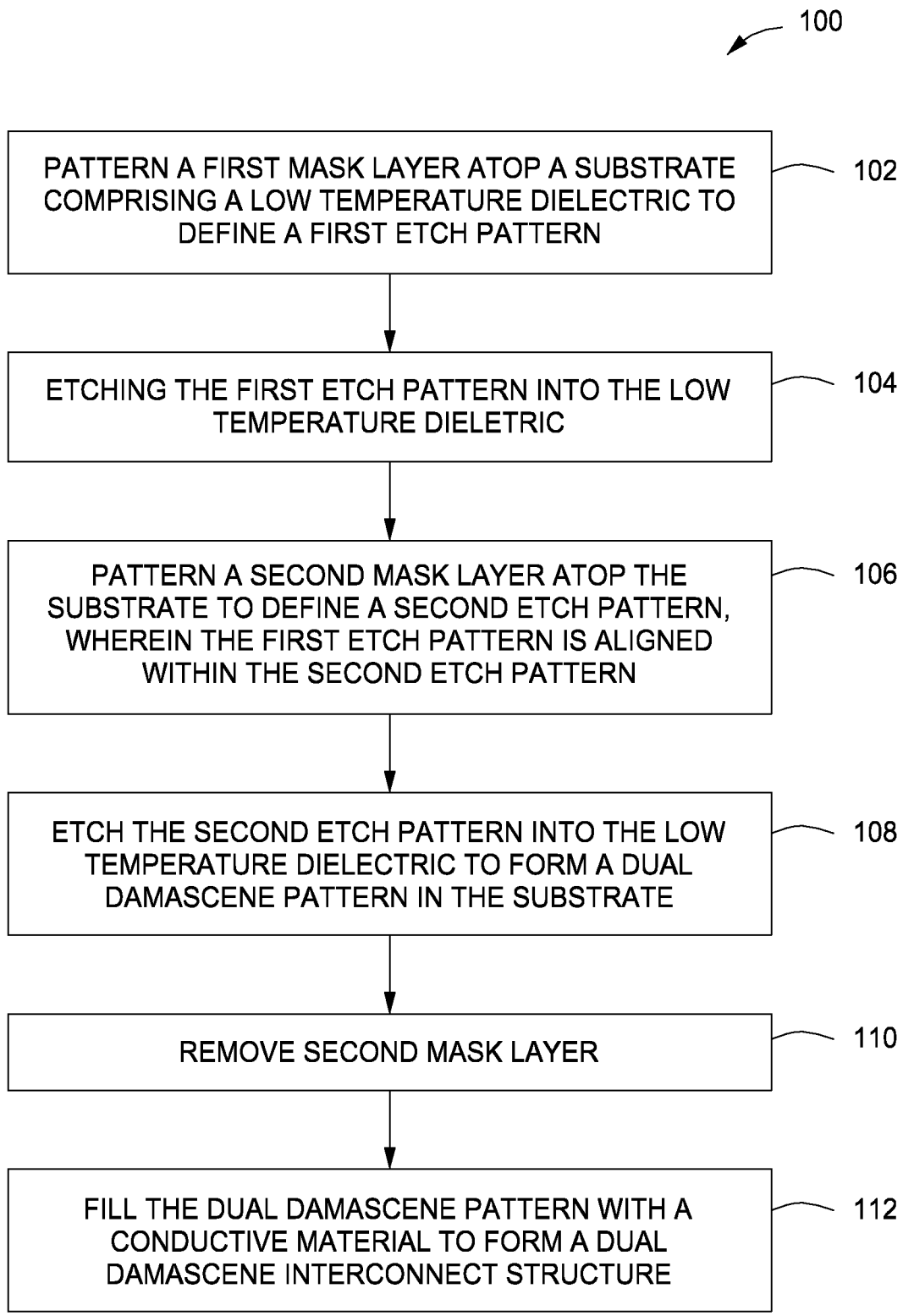
FIG. 1 is a flow chart of a method of fabricating a dual damascene structure in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

The present invention provides embodiments of methods for fabricating dual damascene structures in low temperature dielectric materials. In some illustrative embodiments, such dual damascene structures may be used in high aspect ratio applications, such as through silicon via (TSV) applications. In some illustrative embodiments, such dual damascene structures may be used in a TSV interposer application.

FIG. 1 is a flow chart of a method 100 of fabricating a dual damascene structure in accordance with some embodiments of the present invention. FIGS. 2A-2I schematically depict stages of fabrication of a via first dual damascene structure in accordance with some embodiments of the method 100 of FIG. 1. FIGS. 5A-5F schematically depict stages of fabrication of a via last dual damascene structure in accordance with other embodiments of the method of FIG. 1.

The method 100 generally begins at 102 where a first mask is patterned atop a substrate 200. The substrate 200 may be any suitable substrate, such as a semiconductor wafer. Substrates having other geometries, such as rectangular, polygonal, or other geometric configurations may also be used. Also, substrates comprising additional materials may also be used. The substrate may include one or more additional layers formed thereon. In some embodiments, the substrate 200 may be an interposer substrate for use as an electrical interface to reroute connections, for example from an IC die, to a different connection, for example to a packaging substrate to which the IC is connected.

In some embodiments in which the substrate 200 is an interposer substrate, the substrate may be adhered to a carrier (not shown), for example a glass carrier, for processing. The substrate 200 may be bonded to the carrier with an adhesive substance having a maximum operating temperature of 250° C. At a point in the processing scheme subsequent to the completion of the method 100, the substrate 200 may be removed from the carrier for further processing or as a finished product.

In some embodiments, the substrate may include a plurality of layers formed thereon. For example, as illustrated in FIGS. 2A-2I and FIGS. 5A-5F, the substrate 200 includes a first layer 202. The first layer 202 may be a base material of the substrate 200 (e.g., the substrate itself), or a layer formed on the substrate. A first etch stop layer 206 is disposed atop the first layer 202. A first low temperature dielectric layer 208 is disposed atop the first etch stop layer 206. A second etch stop layer 210 may be disposed atop the first low temperature dielectric layer 208. A second low temperature dielectric layer 212 may be disposed atop the second etch stop layer 210. In some embodiments, when the second etch stop layer 210 is not present, the second low temperature dielectric layer 212 may be disposed directly atop the first low temperature dielectric layer 208, or may be omitted completely and the first low temperature dielectric layer 208 may be formed to a thickness suitable to fabricate the dual damascene structure within the first low temperature dielectric layer 208.

In some embodiments, the first layer 202 may comprise silicon (Si). In some embodiments, the first low temperature dielectric layer 208 and the second low temperature dielectric layer 212 may comprise silicon oxide ($SiO_2$). In some embodiments, the first etch stop layer 206 and the second etch stop layer 210 may comprise silicon nitride ($Si_3N_4$), silicon carbide (SiC), doped silicon carbide films, such as a Barrier Low-K dielectric film (BLOK™), or the like. BLOK™ is a silicon carbide film that may be formed using the chemical vapor deposition (CVD) or plasma enhanced CVD process described in commonly owned U.S. Pat. No. 6,287,990 B1, issued Sep. 11, 2001, and U.S. Pat. No. 6,303,523 B2, issued Oct. 16, 2001.

As used herein, a low temperature dielectric layer is a dielectric layer formed at temperatures below about 180 degrees Celsius. The low temperature dielectric layers 208 (and 212, if present) are layers formed on a substrate at a temperature less than about 180° C. Low temperature dielectric layers 208 and 212 are deposited on a substrate at a substrate temperature far below the substrate temperature of high temperature, or conventional, dielectric layers. For example, typical high temperature dielectric materials are typically deposited at temperatures in excess of about 400° C.

Low temperature dielectrics, i.e., those deposited on substrates with substrate temperatures less than about 180° C., are typically softer than conventional dielectric layers. Because of their softness, and other physical characteristics, low temperature dielectrics cannot be etched under conventional conditions of substrate temperatures in excess of 400° C. or exposure to high energy plasmas, such as created by conventional capacitively coupled plasma etch reactors.

Figure 2A:
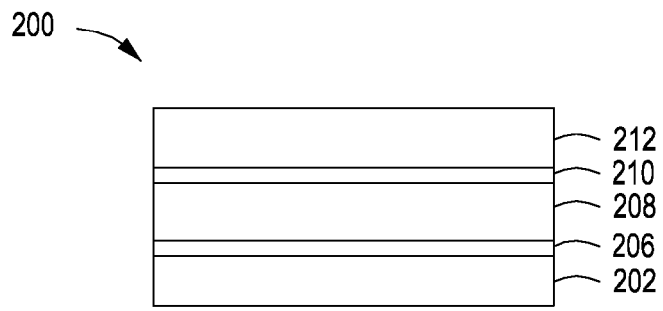
FIGS. 2A-2I schematically depict stages of fabrication of a dual damascene structure using a via first scheme in accordance with some embodiments of the method of FIG. 1.
Figure 2B:
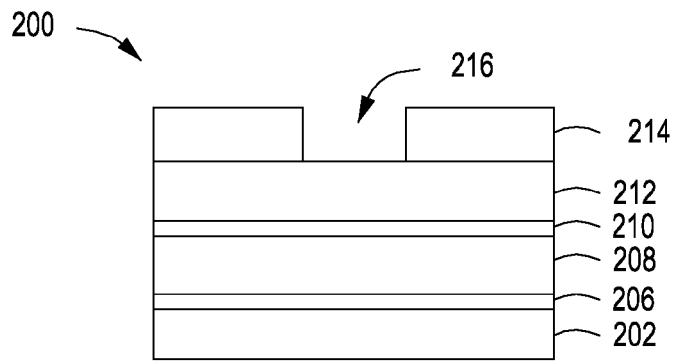
Figure 2C:
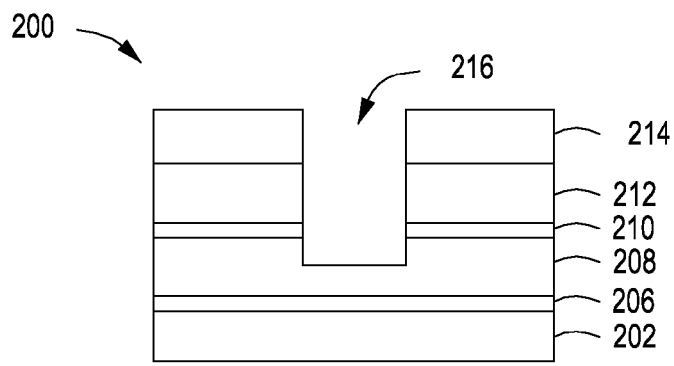

The first mask layer 214 may be deposited and patterned in any suitable manner to define a first etch pattern in the substrate 200. The first etch pattern may be either a trench pattern, or a via pattern. In embodiments where a partial via first approach is used, the first etch pattern may be a via pattern 216 to be etched into the substrate 200, as depicted in FIG. 2B. In FIGS. 2A-2I, the first etch pattern is the via pattern 216. In some embodiments, the via 216 may be etched through the second low temperature dielectric layer 212, through the second etch stop layer 210, and at least partially through the first low temperature dielectric layer 208, as depicted in FIG. 2C. In embodiments where no second etch stop layer 210 is present, the via 216 may be etched through the second low temperature dielectric layer 212, if present, and at least partially through the first low temperature dielectric layer 208.

Next, at 104, the first etch pattern (in this embodiment, the via 216) is etched into the substrate (e.g., through the second dielectric layer 212 and/or partially through the first low temperature dielectric layer 208) using any suitable etch process (e.g., an etch process suitable for etching the first and second low temperature dielectric layers 208, 212 with selectivity against the first etch stop layer 206). For example, in embodiments where the second low temperature dielectric layer 212 comprises silicon oxide, an etchant species such as carbon tetrafluoride ($CF_4$), $CHF_3$, $C_4F_8$, $C_4F_6$, $CH_2F_2$, $NF_3$, $SF_6$, or the like may be provided to etch the via 216.

The etch process may be performed for a predetermined period of time calculated to complete or substantially complete the etch process, or endpoint detection techniques may be used to detect the transition from etching the second dielectric layer 212 to etching the first etch stop layer 206. Upon completion of etching the via 216, any remaining mask material from the first mask layer 214 may be removed, for example, by ashing or the like. Although not meant to be limiting of the scope of the invention, in some embodiments, the via may be etched to a depth of about 1 to about 10 micrometers, or, in some embodiments, about 2 to about 5 micrometers.

Figure 2D:
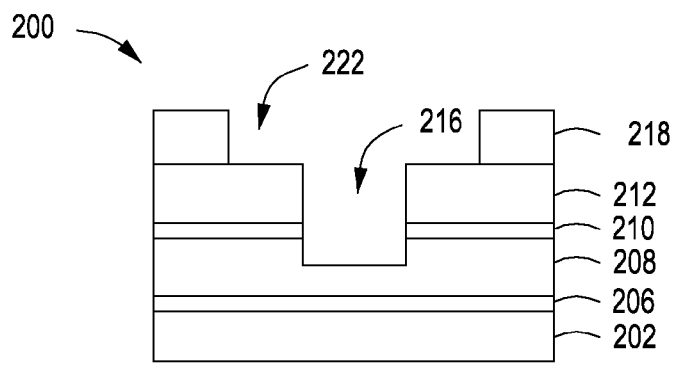

Next, at 106, a second mask layer 218 may be disposed and patterned in any suitable manner atop the substrate 200 to define a pattern for a second etch pattern, in this case, a trench 222 as depicted in FIG. 2D. The second mask layer 218 is developed in such a manner as to create the desired pattern atop the substrate 200.

Figure 2E:
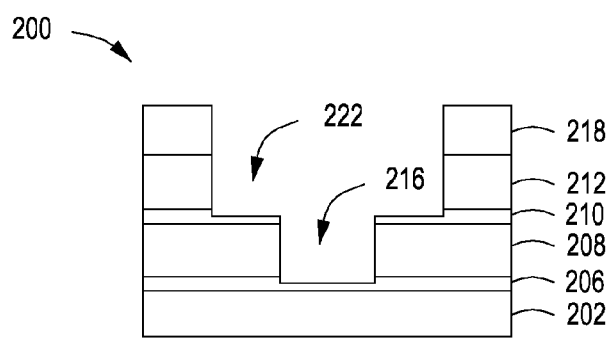
Figure 2F:
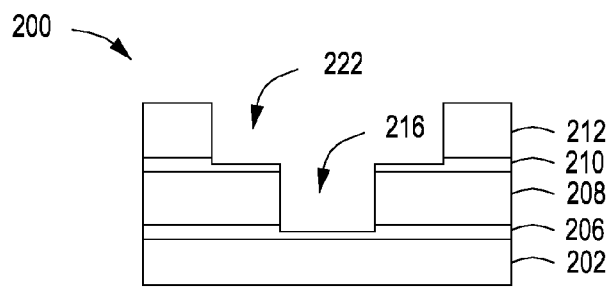

Next, at 108, a second etch pattern, e.g., the trench 222 in embodiments corresponding to the partial via first approach, is etched into the substrate 200 to form a dual damascene pattern in the substrate 200. The trench 222 may be etched into the substrate (e.g., through the second low temperature dielectric layer 212) using any suitable etch process, such as any of the etch process discussed above with respect to etching the via 216. The etched pattern of the trench 222 may extend at least partially through the second etch stop layer 210. In addition to etching the trench 222, the depth of the via 216 may also be increased as illustrated in FIG. 2E, such that the via 216 extends at least partially through the first etch stop layer 206. The etch process may be performed for a predetermined period of time calculated to complete or substantially complete the etch process, or endpoint detection techniques may be used to detect the transition from etching the second low temperature dielectric layer 212 to etching the second etch stop layer 210.

Next, at 110, upon completion of etching the trench 222, any remaining mask material from the second mask layer 218, including any portion in the via 216, may be removed using any suitable method, for example, by ashing, wet cleaning, or the like.

Figure 2G:
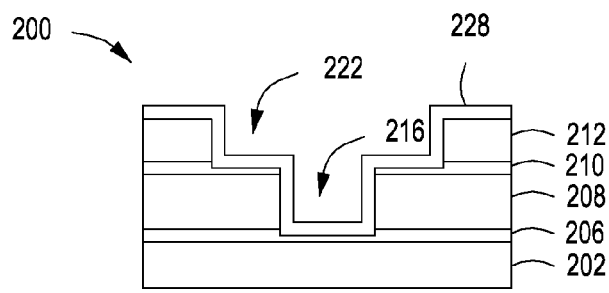
Figure 2H:
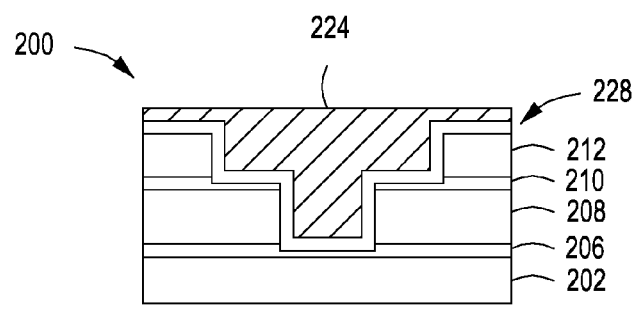
Figure 2I:
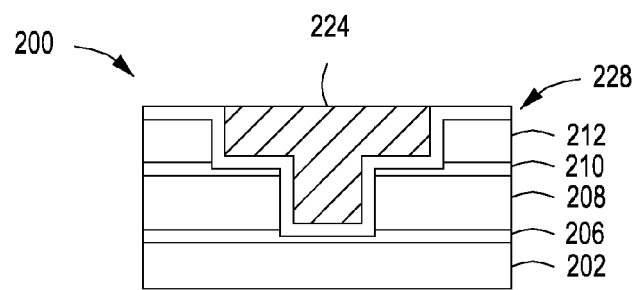

Next, at 112, the dual damascene pattern (e.g., the via 216 and the trench 222) may be filled with a conductive material 224, as depicted in FIG. 2H, to form the dual damascene interconnect structure. In some embodiments, the conductive material is copper. The conductive material may be deposited within the dual damascene pattern using any suitable technique such as plating, chemical vapor deposition (CVD), physical vapor deposition (PVD), or the like. In some embodiments, as illustrated in FIG. 2G, one or more layers 228, such as a liner and/or barrier layer (for example, titanium, tantalum, or nitrides thereof) and/or a seed layer (for example, copper), may be deposited in the dual damascene structure prior to filling the dual damascene pattern with the conductive material 224. In some embodiments, additional processing, such as a chemical mechanical planarization (CMP) process may be performed to remove any overfill of the conductive material atop the substrate 200 as illustrated in FIG. 2I.

In the non-limiting exemplary embodiment described above, the via 216 is at least partially etched first, followed by the etching of the trench 222. This is sometimes known as a partial via first process. In another non-limiting embodiment the trench 222 can be etched first, followed by the etching of the via 216. Sometimes this scheme is referred to as a via last process.

Figure 5A:
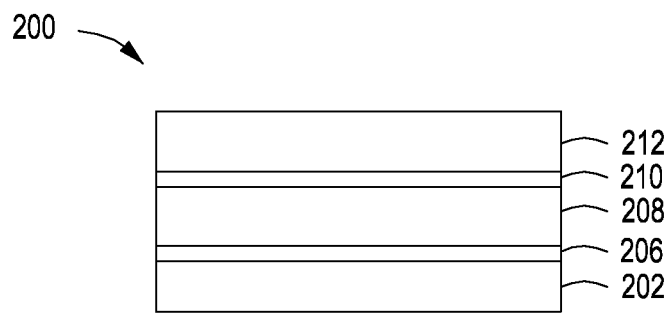
FIGS. 5A-F schematically depict stages of fabrication of a dual damascene structure using a via last scheme in accordance with some embodiments of the method of FIG. 1.
Figure 5B:
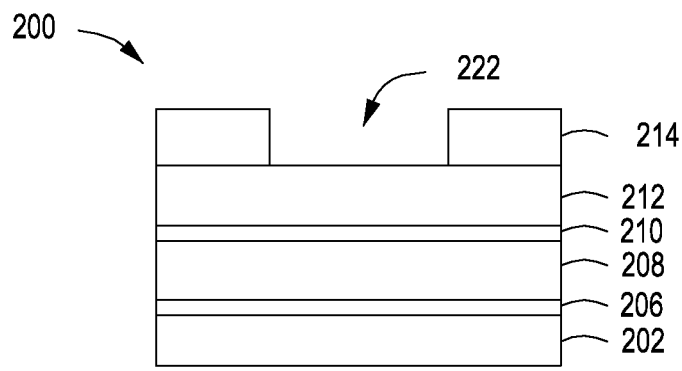
Figure 5C:
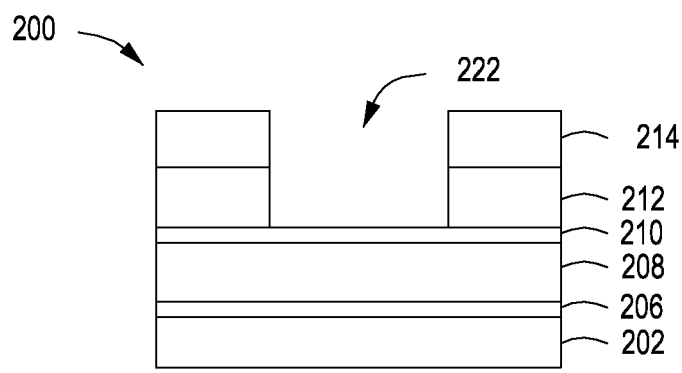

In a via last process, depicted schematically in FIGS. 5A-5F, the substrate to be etched and the patterning and etching processes may be the same as previously described. The first mask layer 214 may be deposited at 102 and patterned in a trench pattern 222, as shown in FIG. 5B, followed by etching the trench 222 at 104 in the substrate 200 as depicted in FIG. 5C. The trench 222 is etched into the substrate (e.g., through the second low temperature dielectric layer 212 and/or partially through the first low temperature dielectric layer 208) using any suitable etch process (e.g., an etch process suitable for etching the first and second low temperature dielectric layers 208, 212 with selectivity against the first etch stop layer 206). As in the above, the duration of the etch process may be for a predetermined period of time, or endpoint detection techniques may be used.

Figure 5D:
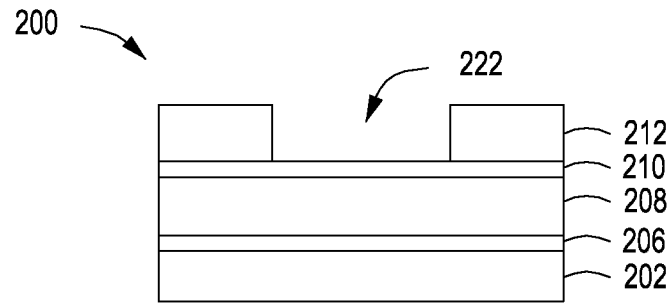
Figure 5E:
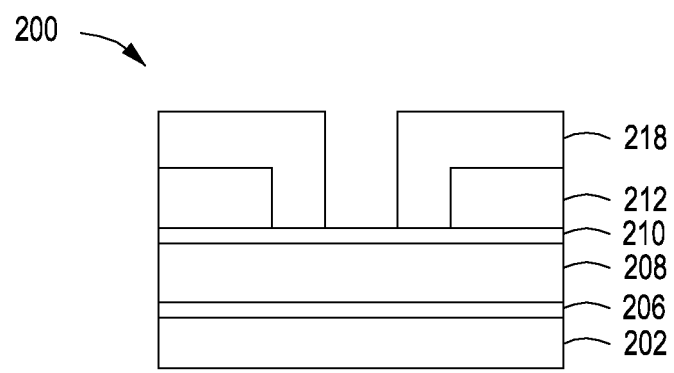

After the first etch operation is performed, the first mask layer 214 may be removed by any suitable process, such as by ashing, as shown in FIG. 5D). A second mask layer 218 in the form of a via pattern may be deposited atop the substrate at 106, as depicted in FIG. 5E. The deposition of the mask may be in any suitable manner as discussed above.

Figure 5F:
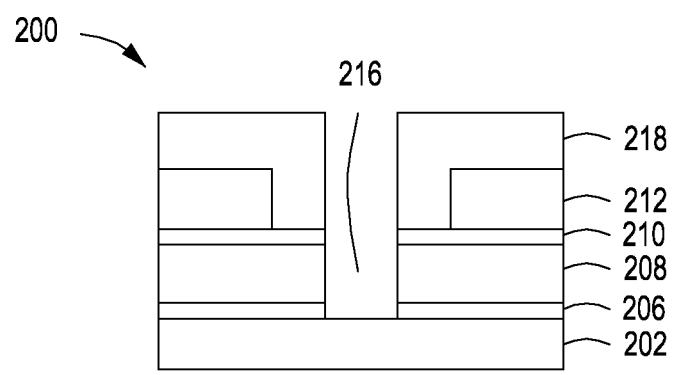

Next, at 108, a second etch pattern, in this embodiment the via 216, may be etched into the substrate 200 to form a dual damascene pattern in the substrate 200, as depicted in FIG. 5F. The via 216 may be etched through the optional second etch stop layer 210, through the first low temperature dielectric layer 208, and may be etched through at least a portion of the first etch stop layer 206. In some embodiments, the via 216 may be etched through the second etch stop layer 210 in a first etch process and then etched through the first low temperature dielectric layer 208 in a second etch process. In some embodiments, the via 216 may be etched through the first layer 202.

Upon completion of the etching process, any remaining second mask layer 218 can be removed by any suitable method, for example by ashing or wet cleaning at 110. The damascene pattern may be filled with a conductive material at 112 to form a dual damascene interconnect structure as described above, including any additional processing, such as CMP.

Figure 4:
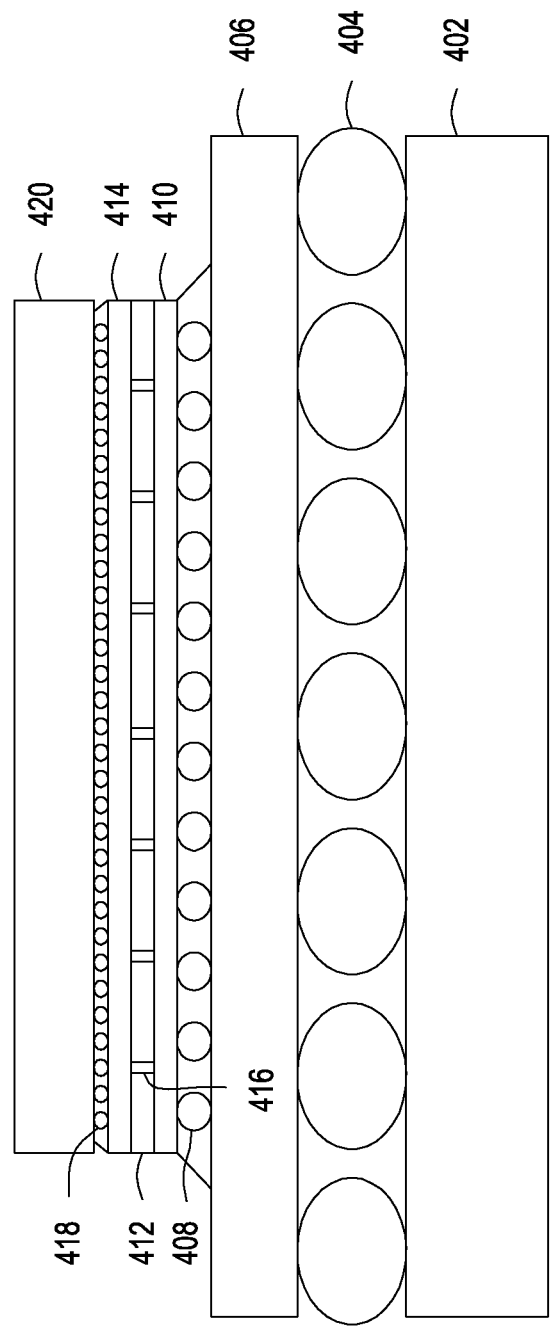
FIG. 4 depicts a simplified side view of a flip chip integrated circuit coupled to an underlying printed circuit board (PCB) via an interposer substrate having one or more dual damascene structures in accordance with some embodiments of the present invention.

Although described above in one exemplary application, the inventive methods described herein may also be used in other applications. For example, FIG. 4 depicts a simplified side view of a flip chip integrated circuit (flip chip 420) coupled to an underlying printed circuit board (PCB) 402 via an interposer substrate 412 having one or more dual damascene structures in accordance with some embodiments of the present invention. The PCB 402 has a plurality of contact pads upon which conductors (e.g., balls 404) are disposed to couple the PCB 402 to an intermediate substrate 406. The typical spacing, or pitch, between adjacent balls on the PCB 402 is about 0.4-0.5 mm. The intermediate substrate 406 may be a flip-chip ball grid array (FC-BGA) substrate or a high density interconnect (HDI) substrate or the like. The intermediate substrate 406 typically only reduces the pitch between adjacent conductors to as small as about 180 micrometers. A second plurality of balls 408 are disposed on the opposite side of the intermediate substrate 406 as the PCB 402 to couple the intermediate substrate 406 to an interposer substrate 412. The typical pitch between adjacent ones of the second plurality of balls 408 is typically 100-200 micrometers.

The interposer substrate 412 may have dual damascene structures formed as described above to redistribute the electrical connections between the second plurality of balls 408 on the intermediate substrate 406 and a third plurality of balls 418 that couple the interposer substrate 412 to the flip chip 420. The third plurality of balls, sometimes referred to as microbumps, may have even smaller pitch than the second plurality of balls. In some embodiments, the interposer substrate 412 may be a silicon substrate (e.g., the first layer 202) and may have one or more low temperature dielectric layers 410 (e.g., the first and optional second low temperature dielectric layers 208, 212) disposed on a first side of the interposer substrate 412 and one or more low temperature dielectric layers 414 (e.g., the first and optional second low temperature dielectric layers 208, 212) disposed on a second side of the interposer substrate 412 opposite the first side. The low temperature dielectric layers may be similar to any of the low temperature dielectric layers disclosed above with respect to FIGS. 2 and 5. A plurality of through silicon vias (TSV) 416 facilitate coupling the conductive pathways formed on either side of the interposer substrate 412. Dual damascene structures may be formed in either or both of the low temperature dielectric layers 410, 414 in the manner as discussed above. Each TSV 416 may be part of the dual damascene structure or aligned with the via portion of the dual damascene structure.

Figure 3:
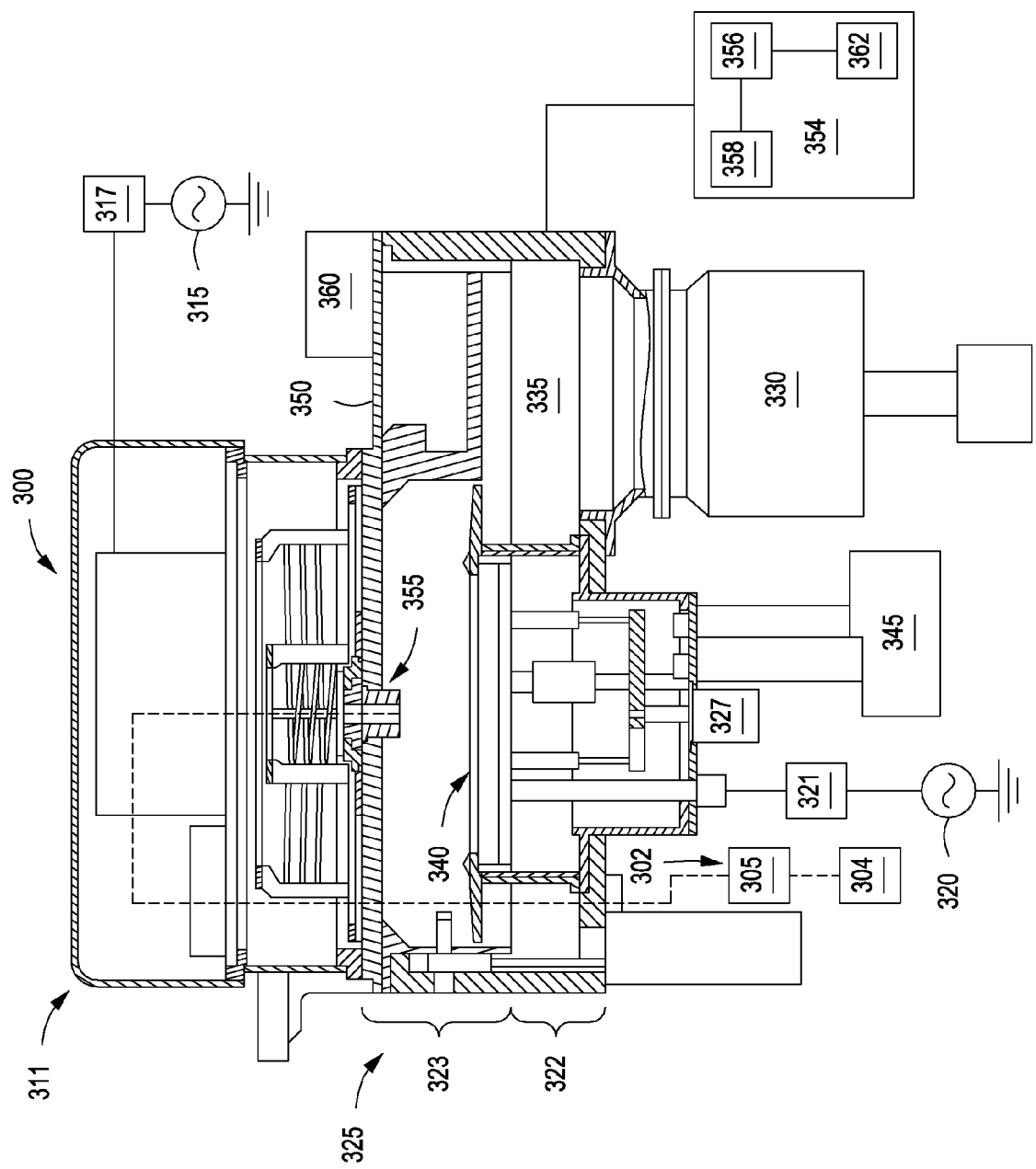
FIG. 3 depicts a schematic side view of an etch reactor suitable to perform portions of the methods of fabricating dual damascene structures in accordance with some embodiments of the present invention.

FIG. 3 illustrates a sectional side view of a system, such as a reactor 300, suitable for processing a variety of substrates and accommodating a variety of substrate sizes in accordance with at least portions, such as the etching processes discussed above, of embodiments of the present invention. In some embodiments, the substrate may be a round wafer, such as a 200 or 300 mm diameter, or larger, such as 450 mm. The substrate can also be any polygonal, square, rectangular, curved or otherwise non-circular workpiece, such as a polygonal glass substrate used in the fabrication of flat panel displays. The reactor 300 may be part of an Applied Centura® Silvia™ Etch system, commercially available from Applied Materials, Inc. of Santa Clara, Calif. Other reactors available from other manufacturers may also be utilized to practice portions of the present invention.

In some embodiments, the reactor 300 may include a source power 315 and a matching network 317, a bias power 320 and a matching network 321, a chamber 325, a pump 330, a valve 335, an electrostatic chuck 340, a chiller 345, a lid 350, a gas nozzle 355, and a gas delivery system 302.

In some embodiments, the gas delivery system 302 is located in a housing 305 disposed directly adjacent, such as under, the chamber 325. The gas delivery system 302 selectively couples one or more gas sources located in one or more gas panels 304 to the gas nozzle 355 to provide process gases to the chamber 325. The housing 305 is located in close proximity to the chamber 325 to reduce gas transition time when changing gases, minimize gas usage, and minimize gas waste.

The reactor 300 may further include a lift 327 for raising and lowering the electrostatic chuck 340 that supports a substrate in the chamber 325. The chamber 325 further includes a body having a lower liner 322, an upper liner 323, and a door for entry and egress of a substrate. The valve 335 may be disposed between the pump 330 and the chamber 325 and may be operable to control pressure within the chamber 325. The electrostatic chuck 340 may be disposed within the chamber 325. The lid 350 may be disposed on the chamber 325.

The gas nozzle 355 may comprise a tunable gas nozzle having one or more outlets to selectively direct gas flow from the gas delivery system 302 to the chamber 325. The gas nozzle 355 may be operable to direct gas flow into different areas within the chamber 325, such as the center area and/or the side areas of the chamber 325. In some embodiments, the gas nozzle 355 may include a first outlet that introduces gases from the top of the chamber 325 and a second outlet that introduces gases from the side of the chamber 325 to selectively control the distribution of the gases in the chamber 325.

The gas delivery system 302 may be used to supply at least two different gas mixtures to the chamber 325 at an instantaneous rate as further described below. In an optional embodiment, the reactor 300 may include a spectral monitor operable to measure the depth of an etched trench and a deposited film thickness as the trench is being formed in the chamber 325, with the ability to use other spectral features to determine the state of the reactor. The reactor 300 may be configured to accommodate a variety of substrate sizes, for example a substrate diameter of up to about 300 mm (although larger or smaller sized substrates may be used in reactors having other configurations). In operation, the reactor 300 is configurable to produce etched substrate trench sidewall profiles having angles that taper in a range of about 85 degrees to about 92 degrees, and etched substrate trenches having depths that range from about 10 micrometers to about 500 micrometers.

In some embodiments, the source power 315 for generating and maintaining the plasma processes is coupled to the chamber 325 via a power generating apparatus enclosed in a power generating apparatus housing 311 disposed above the chamber 325. The source power may be an inductively coupled source power. The source power 315 may be operable to generate a radio frequency within a range from about 2 MHz to about 13.5 MHz, having pulsing capabilities, a power within a range from about 10 watts to about 10,000 watts, for example, from about 4,500 watts to about 5,500 watts and may further include a dynamic matching network 317. In one example, the source power 315 may be operable to generate a 13 MHz radio frequency having pulsing capabilities. The source power 315 may comprise a dual tunable source so that the radio frequency may be changed during an etching cycle. In some embodiments, the source power 315 may comprise a remote plasma source capable of generating high levels of plasma disassociation that is mountable to the reactor 300. When using a remote plasma source, the reactor 300 may further include a plasma distribution plate or series of plates disposed in the chamber 325 to help distribute the plasma to the substrate. In some embodiments, the reactor 300 may include both an in-situ source power and a remote plasma source power, wherein the plasma is generated in a remote plasma chamber using the remote plasma source power and transferred to the reactor chamber 325, wherein the in-situ source power 315 maintains the generated plasma within the chamber 325. In some embodiments, an etching cycle may be performed wherein the power range, i.e. the wattage of the source power 315, may be increased or decreased during the etching cycle. The source power 315 may be pulsed during the etching cycle.

In some embodiments, the bias power 320 for biasing the substrate is coupled to the chamber 325 and the electrostatic chuck 340. The bias power 320 may be operable to generate a radio frequency of about 400 KHz having pulsing capabilities, a low power range from about 10 watts to about 2000 watts, for example, from about 900 to about 1800 watts, and may further include a dynamic matching network 321. In some embodiments, the bias power 320 may be capable of generating a selectable radio frequency range from about 100 kHz to about 13.56 MHz, from about 100 kHz to about 2 MHz, and from about 400 kHz to about 2 MHz, having pulsing capabilities, a low power range from about 10 watts to about 2,000 watts, and may further include a dynamic matching network or a fixed matching network and a frequency tuner. In some embodiments, an etching cycle may be performed wherein the power range, i.e. the wattage of the bias power 320, may be increased or decreased during the etching cycle.

The bias power 320 may be pulsed during the etching cycle. To pulse the bias power 320, the radio frequency power is switched on and off during the etching cycle. The pulsing frequency of the bias power 320 may range from about 10 Hz to about 1,000 Hz, and may range from about 50 Hz to about 180 Hz. In some embodiments, the switching of the power on and off is uniformly distributed in time throughout the etching cycle. In some embodiments, the timing profile of the pulsing may be varied throughout the etching cycle, and may depend on the composition of the substrate. The percentage of time the bias power 320 is switched on, i.e. the duty cycle as described above, is directly related to the pulsing frequency. In some embodiments, when the pulsing frequency ranges from about 10 Hz to about 1000 Hz, the duty cycle ranges from about 30% to about 90%. The bias power frequency and the pulsing frequency may be adjusted depending on the substrate material being processed.

In some embodiments, the chiller 345 may be operable to control the temperature within the chamber 325 and of the substrate located within the chamber 325. The chiller 345 may be located near and coupled to chamber 325. The chiller 345 may include a low temperature chiller, such as a sub-zero point of use thermo-electric chiller, and may further include a direct cooling mechanism for ultra lower temperatures. The chiller 345 is operable to generate temperatures in the range of about −20 degrees to about 80 degrees Celsius, located near the chamber 325 to achieve a faster reaction time, and may include ramping capabilities to allow some level of control to help improve the etch rate. In some embodiments, the chiller 345 is capable of generating temperatures in the range of about −10 degrees to about 60 degrees Celsius and may be located near the chamber 325 to achieve a faster reaction time. In some embodiments, the chiller 345 may be operable to lower the temperature from about −10 degrees Celsius to about −20 degrees Celsius in the chamber 325.

In certain embodiments, the reactor 300 may include an additional cooling mechanism 360 for controlling the temperature of the reactor 300. The additional cooling mechanism 360 may be positioned on the lid 350 to control the temperature of the lid 350 which may exhibit an increased temperature due to the use of the increased source power. The additional cooling mechanism 360 may comprise one or more high cooling capacity fans.

In some embodiments, the reactor 300 is operable to maintain a chamber pressure range of about 10 mTorr to about 1,000 mTorr with the pump 330 and the valve 335, which is coupled to the chamber 325. The chamber pressure can be adjusted during the etching cycle to further improve the trench profiles. For example, the chamber pressure may be rapidly decreased or increased when switching from the deposition step to the etch step. The pump 330 may comprise a turbo pump, a 2,600 L/s turbo pump for example, operable to process flows in the range of about 100 sccm to about 1,000 sccm throughout the chamber 325. In conjunction with the pump 330, the valve 335 may comprise a throttling gate valve with a fast reaction time to help control the process flow and the pressure changes. The reactor 300 may further include a dual manometer to measure the pressure in the chamber 325. In some embodiments, the reactor 300 is operable to maintain a dynamic pressure in the range of about 10 mTorr to about 250 mTorr, for example, from about 60 to about 150 mTorr, during the etching cycle. Optionally, an automatic throttling gate valve control or a valve with preset control points may be utilized, and the dynamic pressure may be sustained at a set-point while changing flow parameters.

In some embodiments, a controller 354 comprises a central processing unit (CPU) 356, a memory 358, and support circuits 362 for the CPU 356 facilitates control of the components of the reactor 300 and, as such, of the etch process, as discussed below in further detail. To facilitate control of the reactor 300, the controller 354 may be one of any form of general-purpose computer processor that can be used in an industrial setting for controlling various chambers and sub-processors. The memory 358, or computer-readable medium, of the CPU 356 may be one or more of readily available memory such as random access memory (RAM), read only memory (ROM), floppy disk, hard disk, or any other form of digital storage, local or remote. The support circuits 362 are coupled to the CPU 356 for supporting the processor in a conventional manner. These circuits include cache, power supplies, clock circuits, input/output circuitry and subsystems, and the like. The inventive methods described herein, or at least portions thereof (e.g., portions performed in the reactor 300, or portions performed by equipment controlled by the controller 354), may be stored in the memory 358 as a software routine. The software routine may also be stored and/or executed by a second CPU (not shown) that is remotely located from the hardware being controlled by the CPU 356.

While the foregoing is directed to embodiments of the present invention, other and further embodiments of the invention may be devised without departing from the basic scope thereof.

The invention claimed is:

1. A method of fabricating a dual damascene structure, comprising:
   patterning a first mask layer atop a substrate disposed in a process chamber, wherein the substrate comprises one or more low temperature dielectric layers to define a first etch pattern, and wherein the one or more low temperature dielectric layers are formed atop the substrate at a temperature below about 180 degrees Celsius;
   etching the first etch pattern into the one or more low temperature dielectric layers using an inductively coupled plasma formed by a power source capable of providing power within a range from about 10 watts to about 10,000 watts at a frequency of about 2 MHz to about 13.5 MHz;
   patterning a second mask layer atop the substrate to define a second etch pattern, wherein the first etch pattern and the second etch pattern are aligned;
   etching the second etch pattern into the one or more low temperature dielectric layers to form a dual damascene pattern in the substrate, wherein a pressure of the process chamber during etching of the first etch pattern and the second etch pattern is about 10 mTorr to about 1000 mTorr; and
   wherein the substrate is an interposer substrate having a plurality of through silicon vias for coupling conductive pathways formed on either side of the interposer substrate.

2. The method of claim 1, further comprising:
   removing the second mask layer; and
   filling the dual damascene pattern with a conductive material to form a dual damascene interconnect structure.

3. The method of claim 1, wherein the first etch pattern is one of a via pattern or a trench pattern, and the second etch pattern is the other of a via pattern or a trench pattern.

4. The method of claim 1, wherein etching at least one of the first etch pattern and the second etch pattern into the substrate comprises etching the one or more low temperature dielectric layers using one or more of $CF_4$, $CHF_3$, $C_4F_8$, $C_4F_6$, $CH_2F_2$, $NF_3$, or $SF_6$.

5. The method of claim 1, wherein the substrate comprises silicon having one or more low temperature dielectric layers disposed atop the silicon.

6. The method of claim 5, wherein the one or more low temperature dielectric layers comprise silicon oxide.

7. The method of claim 6, wherein an etch stop layer is disposed above and adjacent to the silicon, and the etch stop layer is disposed below and adjacent to a low temperature dielectric layer.

8. The method of claim 7, wherein the etch stop layer is one of silicon nitride ($Si_3N_4$) or silicon carbide (SiC).

9. The method of claim 1, wherein the interposer substrate is configured to couple a flip chip integrated circuit coupled to an underlying printed circuit board.

10. The method of claim 1, wherein the through silicon vias are part of the dual damascene structures and are formed during etching via portions of the dual damascene structure.

11. The method of claim 1, wherein the through silicon vias are formed in the interposer substrate prior to etching the dual damascene structure, and wherein the method further comprises:
aligning via portions of the dual damascene structure with the through silicon vias of the interposer substrate.

12. The method of claim 1, wherein the dual damascene structure is formed on a first side of the substrate, and further comprising:
forming a second dual damascene structure on a second side of the substrate, opposite the first side, and wherein the dual damascene structure and the second dual damascene structure are aligned with a through silicon via of the plurality of through silicon vias to provide a pathway that extends through the substrate from the first side to the second side.

13. A computer readable medium, having instructions stored thereon that, when executed by a controller, cause a method of fabricating a dual damascene interconnect structure to be performed, the method comprising:
patterning a first mask layer atop a substrate disposed in a process chamber, wherein the substrate comprises one or more low temperature dielectric layers to define a first etch pattern, and wherein the one or more low temperature dielectric layers are formed atop the substrate at a temperature below about 180 degrees Celsius;
etching the first etch pattern into the one or more low temperature dielectric layers using an inductively coupled plasma formed by a power source capable of providing power within a range from about 10 watts to about 10,000 watts at a frequency of about 2 MHz to about 13.5 MHz;
patterning a second mask layer atop the substrate to define a second etch pattern, wherein the first etch pattern is aligned within the second etch pattern;
etching the second etch pattern into the one or more low temperature dielectric layers to form a dual damascene pattern in the substrate, wherein a pressure of the process chamber during etching of the first etch pattern and the second etch pattern is about 10 mTorr to about 1000 mTorr;
and
wherein the substrate is an interposer substrate having a plurality of through silicon vias for coupling conductive pathways formed on either side of the interposer substrate.

14. The computer readable medium of claim 13, further comprising:
removing the second mask layer; and
filling the dual damascene pattern with a conductive material to form a dual damascene interconnect structure.

15. The computer readable medium of claim 13, wherein the first etch pattern is one of a via pattern or a trench pattern, and the second etch pattern is the other of a via pattern or a trench pattern.

16. The computer readable medium of claim 13, wherein the substrate comprises silicon having one or more low temperature dielectric layers disposed atop the silicon.

17. A system for plasma etching a substrate comprising low temperature dielectrics, the system comprising:
an inductively coupled process chamber for processing a substrate;
a controller comprising a computer readable medium, having instructions stored thereon that, when executed by a controller, cause a method of fabricating a dual damascene interconnect structure to be performed, the method comprising:
patterning a first mask layer atop a substrate disposed in a process chamber, wherein the substrate comprises one or more low temperature dielectric layers to define a first etch pattern, and wherein the one or more low temperature dielectric layers are formed atop the substrate at a temperature below about 180 degrees Celsius;
etching the first etch pattern into the one or more low temperature dielectric layers using an inductively coupled plasma formed by a power source capable of providing power within a range from about 10 watts to about 10,000 watts at a frequency of about 2 MHz to about 13.5 MHz;
patterning a second mask layer atop the substrate to define a second etch pattern, wherein the first etch pattern is aligned within the second etch pattern;
etching the second etch pattern into the one or more low temperature dielectric layers to form a dual damascene pattern in the substrate, wherein a pressure of the process chamber during etching of the first etch pattern and the second etch pattern is about 10 mTorr to about 1000 mTorr; and
wherein the substrate is an interposer substrate having a plurality of through silicon vias for coupling conductive pathways formed on either side of the interposer substrate.

18. The system of claim 17, wherein the first etch pattern is one of a via pattern or a trench pattern, and the second etch pattern is the other of a via pattern or a trench pattern.

19. The system of claim 17, wherein etching at least one of the first etch pattern and the second etch pattern into the substrate comprises etching the one or more low temperature dielectric layers using one or more of $CF_4$, $CHF_3$, $C_4F_8$, $C_4F_6$, $CH_2F_2$, $NF_3$, or $SF_6$.

20. The system of claim 17, wherein the one or more low temperature dielectric layers comprise silicon oxide.

* * * * *